US009564417B2

(12) United States Patent
Byun et al.

(10) Patent No.: US 9,564,417 B2
(45) Date of Patent: Feb. 7, 2017

(54) MULTI-STACKED STRUCTURES OF SEMICONDUCTOR PACKAGES

(71) Applicant: Samsung Electronics Co., Ltd., Suwon-si, Gyeonggi-do (KR)

(72) Inventors: Jae-Bum Byun, Suwon-si (KR); Cheol Kwon, Suwon-si (KR); Jong-Yun Yun, Yongin-si (KR); Do-Il Kong, Hwaseong-si (KR); Sung-Chul Hur, Yongin-si (KR)

(73) Assignee: Samsung Electronics Co., Ltd. (KR)

( * ) Notice: Subject to any disclaimer, the term of this patent is extended or adjusted under 35 U.S.C. 154(b) by 0 days.

(21) Appl. No.: 14/848,415

(22) Filed: Sep. 9, 2015

(65) Prior Publication Data

US 2016/0086917 A1 Mar. 24, 2016

(30) Foreign Application Priority Data

Sep. 24, 2014 (KR) .................. 10-2014-0127569

(51) Int. Cl.
*H01L 23/00* (2006.01)
*H01L 25/065* (2006.01)
*H01L 23/367* (2006.01)
*H01L 23/38* (2006.01)
*H01L 23/427* (2006.01)
*H01L 23/433* (2006.01)
*H01L 23/498* (2006.01)

(52) U.S. Cl.
CPC ......... *H01L 25/0652* (2013.01); *H01L 23/367* (2013.01); *H01L 23/3675* (2013.01); *H01L 23/3677* (2013.01); *H01L 23/38* (2013.01); *H01L 23/427* (2013.01); *H01L 23/4334* (2013.01); *H01L 23/49822* (2013.01); *H01L 2224/16225* (2013.01); *H01L 2225/06572* (2013.01); *H01L 2225/06589* (2013.01)

(58) Field of Classification Search
None
See application file for complete search history.

(56) References Cited

U.S. PATENT DOCUMENTS

| | | |
|---|---|---|
| 8,547,703 B2 | 10/2013 | Aoki et al. |
| 8,625,279 B2 | 1/2014 | Hata et al. |
| 2006/0197181 A1* | 9/2006 | Noguchi ............ H01L 23/3677 257/530 |
| 2006/0222342 A1 | 10/2006 | Funaki |
| 2011/0042130 A1 | 2/2011 | Lim et al. |
| 2013/0199770 A1 | 8/2013 | Cherian |

(Continued)

FOREIGN PATENT DOCUMENTS

| | | |
|---|---|---|
| JP | 2010-147362 | 7/2010 |
| JP | 2012-169330 | 9/2012 |

(Continued)

*Primary Examiner* — William Harriston
(74) *Attorney, Agent, or Firm* — Myers Bigel, P.A.

(57) ABSTRACT

A multi-stacked structure of semiconductor packages includes a plurality of substrates stacked in a vertical direction, semiconductor packages mounted on each substrate of the plurality of the substrates, a heat release column extending commonly through the plurality of the substrates and overlapping at least one semiconductor package serving as a heat generation source among the semiconductor packages in the vertical direction, and a heat dissipation part thermally connected to one end of the heat release column.

19 Claims, 12 Drawing Sheets

(56) References Cited

U.S. PATENT DOCUMENTS

| | | |
|---|---|---|
| 2014/0036435 A1 | 2/2014 | Kim |
| 2014/0077354 A1 | 3/2014 | Yamamoto et al. |
| 2014/0117528 A1 | 5/2014 | Byun et al. |
| 2014/0146461 A1 | 5/2014 | Choi et al. |

FOREIGN PATENT DOCUMENTS

| | | |
|---|---|---|
| JP | 2013-211480 | 10/2013 |
| JP | 2013-247230 | 12/2013 |
| KR | 10-0986230 | 2/2010 |

* cited by examiner

MULTI-STACKED STRUCTURES OF SEMICONDUCTOR PACKAGES

CROSS-REFERENCE TO RELATED APPLICATION

This application claims priority to Korean Patent Application No. 10-2014-0127569, filed Sep. 24, 2014, the contents of which are hereby incorporated herein by reference.

FIELD

Example embodiments relate to multi-stacked structures of semiconductor packages. More particularly, example embodiments relate to multi-stacked structures of semiconductor packages including a plurality of printed circuit boards.

BACKGROUND

To realize highly-integrated and multi-functional semiconductor devices, a packaging technology for mounting a plurality of semiconductor packages or printed circuit boards (PCBs) has been developed. However, as the stacked number of the semiconductor packages or the PCBs increase, heat may accumulate, which may result in a reduction of mechanical and operational reliability of a stacked structure.

Therefore, a method of efficiently releasing heat from stacked structures may be needed.

SUMMARY

Example embodiments provide a multi-stacked structure of semiconductor packages having improved mechanical and operational reliability.

According to example embodiments, there is provided multi-stacked structure of semiconductor packages. The multi-stacked structure includes a plurality of substrates stacked in a vertical direction, semiconductor packages mounted on each substrate of the plurality of the substrates, a heat release column extending commonly through the plurality of the substrates and overlapping at least one semiconductor package serving as a heat generation source among the semiconductor packages in the vertical direction, and a heat dissipation part thermally connected to one end of the heat release column.

In example embodiments, the heat release column may include a metal column, a heat pipe and/or a thermal electric cooler (TEC).

In example embodiments, the heat release column may be directly on a maximum heat generation package among the semiconductor packages.

In example embodiments, the maximum heat generation package may be mounted on a lower surface of a lowermost substrate among the plurality of the substrates.

In example embodiments, the semiconductor packages may include a memory package and a logic package, and the maximum heat generation package may be the logic package.

In example embodiments, each substrate may include signal wirings and ground wirings. The heat release column may be in contact with the ground wirings, and may be spaced apart from the signal wirings.

In example embodiments, the heat release column may be landed on a top surface of one of the ground wirings included in a lowermost substrate among the plurality of the substrates.

In example embodiments, the multi-stacked structure may further include a thermal conductive adhesive interposed between a bottom of the heat release column and the top surface of the one of the ground wirings.

In example embodiments, the thermal conductive adhesive may include a thermal interface material (TIM).

In example embodiments, the multi-stacked structure may further include insulation patterns formed at lateral portions of the signal wirings adjacent to a sidewall of the heat release column.

In example embodiments, the multi-stacked structure may further include an insulation layer pattern surrounding a sidewall of the heat release column.

In example embodiments, the multi-stacked structure may further include a case accommodating the plurality of the substrates. The heat dissipation part may include a first thermal conductive adhesive in contact with the heat release column, a second thermal conductive adhesive in contact with the case, and a thermal dissipation plate between the first thermal conductive adhesive and the second thermal conductive adhesive.

In example embodiments, the heat release column may include a plurality of stacked heat release columns which partially overlap each other along the vertical direction.

In example embodiments, each substrate may include signal wirings and ground wirings. Neighboring stacked heat release columns among the plurality of the stacked heat release columns may be connected to each other by the ground wirings.

According to example embodiments, there is provided a multi-stacked structure of semiconductor packages. The multi-stacked structure includes a first substrate, a second substrate and a third substrate sequentially stacked in a vertical direction, a plurality of semiconductor packages mounted on the first substrate, the second substrate and the third substrate, a first heat release column extending through the first substrate and being in contact with a semiconductor package mounted on the second substrate among the plurality of the semiconductor packages, and a second heat release column overlapping the first heat release column in the vertical direction and extending through the third substrate and the second substrate.

In example embodiments, the semiconductor package in contact with the first heat release column may be a maximum heat generation package among the plurality of the semiconductor packages.

In example embodiments, the semiconductor package in contact with the first heat release column may include a mounting surface and a non-mounting surface. The mounting surface may be connected to the second substrate via conductive members, and the non-mounting surface may face the mounting surface. The multi-stacked structure may further include a thermal conductive adhesive between a top surface of the first heat release column and the non-mounting surface.

In example embodiments, each of the first substrate, the second substrate and the third substrate may include ground wirings and signal wirings. The second heat release column may extend partially through the second substrate such that the second heat release column may be landed on a top surface of a ground wiring included in the ground wirings of the second substrate.

According to example embodiments, there is provided multi-stacked structure of semiconductor packages. The multi-stacked structure includes a plurality of substrates stacked in a vertical direction and including a circuit wiring therein, a plurality of semiconductor packages mounted on the plurality of the substrates, a plurality of stacked heat release columns stacked along the vertical direction in a zigzag arrangement through the plurality of the substrates, and a heat dissipation part thermally connected to at least one of the stacked heat release columns.

In example embodiments, neighboring stacked heat release columns among the plurality of the stacked heat release columns may form a parallel connection by ground wirings included in the circuit wiring.

BRIEF DESCRIPTION OF THE DRAWINGS

Example embodiments will be more clearly understood from the following detailed description taken in conjunction with the accompanying drawings.

FIGS. 1A and 1B are cross-sectional views illustrating multi-stacked structures of semiconductor packages in accordance with example embodiments;

FIGS. 2 to 5 are partially enlarged cross-sectional views of portions indicated by dotted circles in FIGS. 1A and 1B;

FIG. 6 is a cross-sectional view illustrating a multi-stacked structure of semiconductor packages in accordance with some example embodiments;

FIGS. 7 to 10 are partially enlarged cross-sectional views of a portion indicated by a dotted circle in FIG. 6;

FIG. 11 is a cross-sectional view illustrating a multi-stacked structure of semiconductor packages in accordance with some example embodiments;

FIGS. 12 to 15 are partially enlarged cross-sectional views of a portion indicated by a dotted circle in FIG. 11;

FIG. 16 is a cross-sectional view illustrating a multi-stacked structure of semiconductor packages in accordance with some example embodiments;

FIG. 17 is a cross-sectional view illustrating a multi-stacked structure of semiconductor packages in accordance with example embodiments;

FIG. 18 is a partially enlarged cross-sectional view of a portion indicated by a dotted circle "A" in FIG. 17;

FIG. 19 is a partially enlarged cross-sectional view of a portion indicated by a dotted circle "B" in FIG. 17; and FIG. 20 is a schematic block diagram illustrating an information processing system in accordance with example embodiments.

DESCRIPTION OF EMBODIMENTS

Figure 1A:
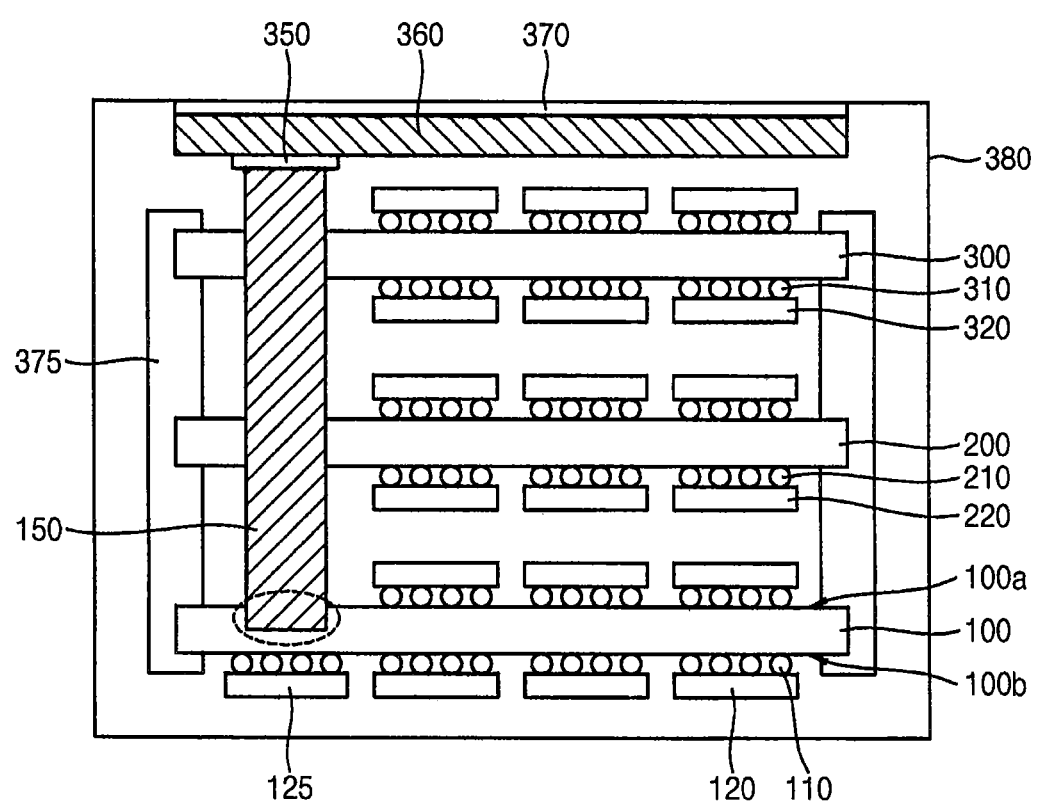
FIGS. 1A, 1B, and 2 to 20 represent non-limiting, example embodiments as described herein.

Various example embodiments will be described more fully hereinafter with reference to the accompanying drawings, in which some example embodiments are shown. The present inventive concept may, however, be embodied in many different forms and should not be construed as limited to the example embodiments set forth herein. Rather, these example embodiments are provided so that this description will be thorough and complete, and will fully convey the scope of the present inventive concept to those skilled in the art. In the drawings, the sizes and relative sizes of layers and regions may be exaggerated for clarity.

It will be understood that when an element or layer is referred to as being "on," "connected to" or "coupled to" another element or layer, it can be directly on, connected or coupled to the other element or layer or intervening elements or layers may be present. In contrast, when an element is referred to as being "directly on," "directly connected to" or "directly coupled to" another element or layer, there are no intervening elements or layers present. Like numerals refer to like elements throughout. As used herein, the term "and/or" includes any and all combinations of one or more of the associated listed items.

It will be understood that, although the terms first, second, third, fourth etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the present inventive concept.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

The terminology used herein is for the purpose of describing particular example embodiments only and is not intended to be limiting of the present inventive concept. As used herein, the singular forms "a," "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Example embodiments are described herein with reference to cross-sectional illustrations that are schematic illustrations of idealized example embodiments (and intermediate structures). As such, variations from the shapes of the illustrations as a result, for example, of manufacturing techniques and/or tolerances, are to be expected. Thus, example embodiments should not be construed as limited to the particular shapes of regions illustrated herein but are to include deviations in shapes that result, for example, from manufacturing. For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of the present inventive concept.

Unless otherwise defined, all terms (including technical and scientific terms) used herein have the same meaning as commonly understood by one of ordinary skill in the art to which this inventive concept belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Figure 1B:
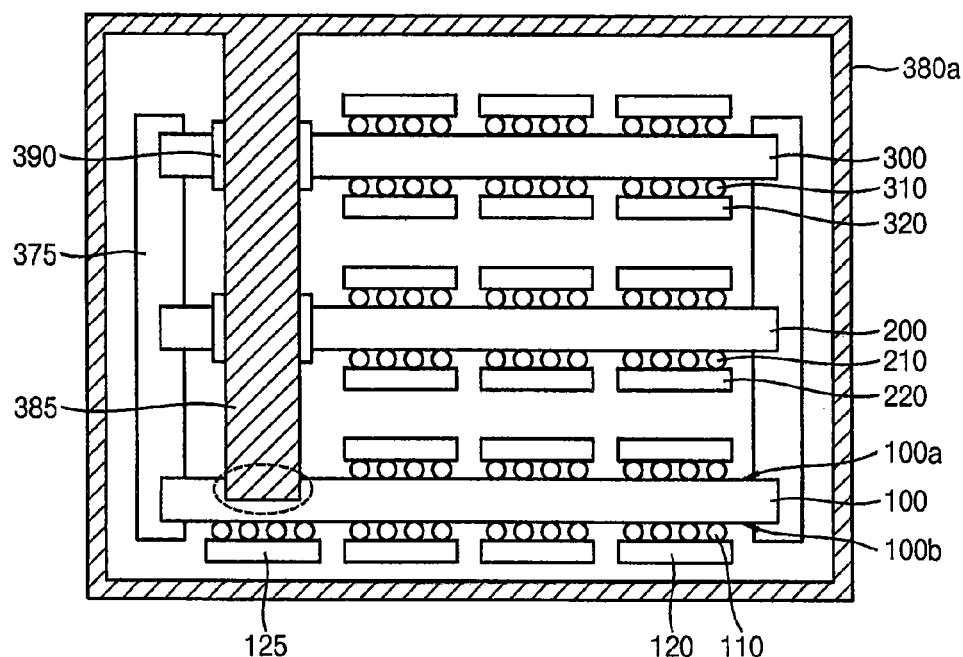

FIGS. 1A and 1B are cross-sectional views illustrating multi-stacked structures of semiconductor packages in accordance with example embodiments.

Referring to FIG. 1A, the multi-stacked structure of semiconductor packages (hereinafter, abbreviated as the multi-stacked structure) may include a first stack structure, a second stack structure and a third stack structure which may be sequentially mounted. The first to third stack structures may be stacked on each other and supported by a connector 375.

The first to third stack structures may be substantially integral with each other by the connector 375, and may be accommodated in a case 380.

A heat release column 150 may extend through the first to third stack structures. For example, the heat release column 150 may be thermally connected to the case 380, and may discharge a heat generated from the first to third stack structures to, e.g., an outside of the case 380.

The first stack structure, the second stack structure and the third stack structure may include a first substrate 100, a second substrate 200 and a third substrate 300, respectively. A first semiconductor package 120, a second semiconductor package 220 and a third semiconductor package 320 may be mounted on the first substrate 100, the second substrate 200 and the third substrate 300, respectively.

For example, a first conductive member 110, a second conductive member 210 and a third conductive member 310 may be arranged on the first substrate 100, the second substrate 200 and the third substrate 300, respectively. The first semiconductor package 120, the second semiconductor package 220 and the third semiconductor package 320 may be disposed on the first conductive member 110, the second conductive member 210 and the third conductive member 310, respectively, to be electrically connected to circuits or wirings included in the substrates 100, 200 and 300.

The first to third stack structures may have elements and/or constructions substantially the same as or similar to that of each other. Thus, the elements and/or the constructions of the first stack structure are described in detail, and detailed descriptions on the elements and/or the constructions of the second and third stack structures are omitted for brevity.

The number of the stack structures included in the multi-stacked structure may be adjusted in consideration of a degree of integration. For example, the multi-stacked structure may include at least four stack structures. In this case, an additional package substrate may be interposed between the first substrate 100 and the second substrate 200, or between the second substrate 200 and the third substrate 300.

The first substrate 100 may be a printed circuit board (PCB) in which the circuits and the wirings are formed. For example, the first substrate 100 may be a ball grid array (BGA) substrate. The first substrate 100 may include a rigid PCB, a flexible PCB or a rigid-flexible PCB.

The first substrate 100 may include a first surface 100a and an opposite second surface 100b substantially facing away from each other. In example embodiments, the first conductive members 100 may be arranged on both the first surface 100a and the second surface 100b, so that the mounted number of the first semiconductor packages 120 may be increased.

For example, the first conductive member 110 may include a metal, and may have a shape of a conductive ball or a conductive bump such as a solder ball. The first semiconductor package 120 may be mounted on the first conductive members 110 by a flip-chip method.

In some embodiments, conductive pads may be formed on the first and/or second surfaces 100a and 10013 of the first substrate 100, and the first semiconductor package 120 may be electrically connected to the conductive pads via a conductive wire.

In some embodiments, a through silicon via (TSV) may be formed through the first semiconductor package 120, and the first semiconductor package 120 may be electrically connected to the first conductive member 110 via the TSV.

In some embodiments, an underfill material may be filled in a space between the first semiconductor package 120 and the first substrate 100 so that the first semiconductor package 120 may be fixed to the first substrate 100.

The first semiconductor package 120 may include a logic package and a memory package. The memory package may include volatile or non-volatile memory devices. Examples of the volatile memory device may include a dynamic random access memory (DRAM) device or a static random access memory (SRAM) device. Examples of the non-volatile memory device may include a NAND Flash device, a phase change random access memory (PRAM) device, a magnetic random access memory (MRAM) device, or a resistive random access memory (RRAM) device.

The logic package may include a logic device configured to control the memory device.

In example embodiments, the logic package may generate a heat greater than that from the memory package. In this case, at least one of the first semiconductor packages 120 may be defined as a maximum heat generation package 125, and the maximum heat generation package 125 may be the logic package.

In some embodiments, the maximum heat generation package 125 may be disposed at a peripheral portion of the first substrate 100 relatively to the memory packages.

The connector 375, as illustrated in FIG. 1A, may include, e.g., concave portions or hooks accommodating the first to third substrates 100, 200 and 300. Thus, the first to third substrates 100, 200 and 300 may be supported and stacked by the connector 375.

In some embodiments, the connector 375 may include a pillar or a molding interposed between the first substrate 100 and the second substrate 200, and/or between the second substrate 200 and the third second substrate 300.

In example embodiments, the heat release column 150 may extend commonly through the first to third substrates 100, 200 and 300. In some embodiments, the heat release column 150 may extend completely through the third substrate 300 and the second substrate 200, and partially through the first substrate 100. In this case, one end of the heat release column 150 may be inserted in an upper portion of the first substrate 100.

The heat release column 150 may include a metal having an improved thermal conductivity. In some embodiments, the heat release column 150 may include a heat pipe. In this case, the heat release column 150 may have a volatile liquid in a hollow metal pipe. In some embodiments, the heat release column 150 may include a thermal electric cooler (TEC) utilizing, e.g., a Peltier effect.

A large amount of a heat transfer or a heat conduction may be realized when using the heat pipe or the TEC as the heat release column 150.

In example embodiments, the heat release column 150 may be superimposed directly on the maximum heat generation package 125, e.g., the logic package. Accordingly, a large amount of heat from the maximum heat generation package 125 may be absorbed by the heat release column 150 because of a reduced distance between the heat release column 150 and the maximum heat generation package 125.

The heat release column 150 may protrude from, e.g., an upper portion of the third substrate 300 to be connected to a heat dissipation part. In example embodiments, the heat release column 150 may transfer or release the heat absorbed from the packages via a thermal dissipation plate 360 serving as the heat dissipation part.

The heat dissipation plate 360 may have an area substantially fully covering a top surface of the third substrate 300 so that an area for the heat transfer or the heat conduction may be increased. The heat dissipation plate 360 may include a metal, a nano-carbon material such as graphene or graphite, an organic material having a high thermal conductivity, etc. In some embodiments, the heat dissipation plate 360 may have a structure of the above-mentioned heat pipe or the TEC.

In some embodiments, the heat release column 150 may be in direct contact with the heat dissipation plate 360.

In some embodiments, a first thermal conductive adhesive 350 may be interposed between the heat release column 150 and the heat dissipation plate 360. For example, the first thermal conductive adhesive 350 may include a thermal interface material (TIM). The TIM may include a material having a high thermal conductivity such as grease, a silicone-based adhesive material, etc.

In example embodiments, a second thermal conductive adhesive 370 may be interposed between the thermal dissipation plate 360 and the case 380. Accordingly, the heat collected by the thermal dissipation plate 360 may be emitted outside via the second thermal conductive adhesive 370 and the case 380.

For example, a metal case may be used as the case 380.

Referring to FIG. 1B, a heat release column 385 may be integral with a case 380a. For example, the heat release column 385 and the case 380a may be provided as a single and unitary member. In this case, the heat release column 385 and the case 380a may include a metal having an improved thermal conductivity. Accordingly, heat from the first to third stack structures may be directly released through the case 380a via the heat release column 385.

In example embodiments, the case 380a may be divided into an upper portion and a lower portion, and the upper portion may include the heat release column 385. The upper portion may be located such that the heat release column 385 may be inserted through holes formed in the second substrate 200 and the third substrate 300, and the lower portion may be joined to the upper portion such that the multi-stacked structure may be encapsulated by the case 380a.

In some embodiments, an additional thermal conductive adhesive 390 may be formed on a lateral portion of the heat release column 385. The thermal conductive adhesive 390 may include, e.g., a TIM, and may be in contact with the holes formed in the second substrate 200 and the third substrate 300. Accordingly, an insulation between wirings included in the second and third substrates 200 and 300, and the heat release column 385 may be achieved, and a heat generated from the wirings may be absorbed or released by the heat release column 385.

FIGS. 2 to 5 are partially enlarged cross-sectional views of portions indicated by dotted circles in FIGS. 1A and 1B.

Figure 2:
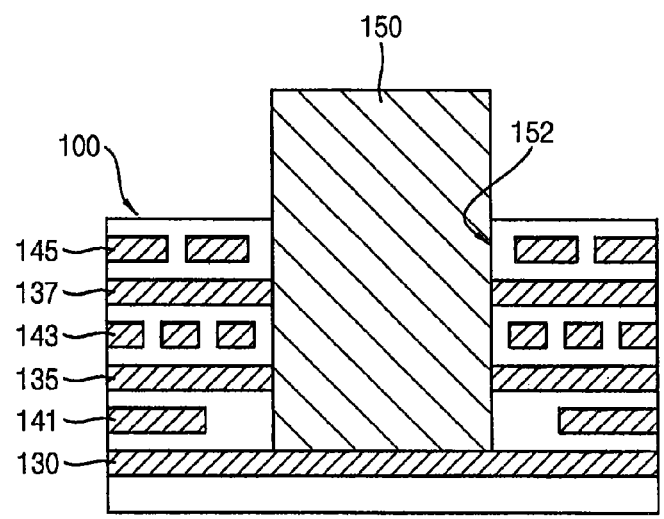

Referring to FIG. 2, a plurality of circuit wirings may be included in the first substrate 100. The circuit wirings may include a ground wiring and a signal wiring, each of which may be provided as a multi-stacked wirings. At least a portion of the circuit wirings may be electrically connected to the first conductive member 110.

Each of the ground wiring and the signal wiring may be formed at 3 levels. In this case, the ground wiring may include first to third ground wirings 130, 135 and 137, and the signal wirings may include first to third signal wirings 141, 143 and 145.

However, the number of the levels of the circuit wirings is not specifically limited herein, and may be adjusted in consideration of a circuit integration in the substrate. For example, each of the ground wiring and the signal wiring may be formed at a single level or 2 levels. Each of the ground wiring and the signal wiring may be formed at equal to or more than 4 levels.

A portion of the first substrate 100 except for an area for the circuit wirings may include an insulation material such as an epoxy resin including, e.g., a glass fabric.

In example embodiments, the heat release column 150 may extend partially through the first substrate 100, and may be in contact with a top surface of the first ground wiring 130. For example, a first hole 152 extending through the first substrate 100 and exposing the top surface of the first ground wiring 130 may be formed, and the heat release column 150 may be inserted in the first hole 152. A second hole and a third hole may be also formed in the second substrate 200 and the third substrate 300, respectively, to vertically overlap the first hole 152. The heat release column 150 may be commonly inserted through the second and third holes.

In some embodiments, lateral surfaces of the second ground wiring 135 and the third ground wiring 137 may be exposed by a sidewall of the first hole 152. Accordingly, the heat release column 150 may be also in contact with the lateral surfaces of the second ground wiring 135 and the third ground wiring 137.

As described above, the heat release column 150 may be in contact with the ground wirings 130, 135 and 137 so that a heat generated from the circuit wirings may be effectively emitted or released via the heat release column 150. In this case, the ground wirings 130, 135 and 137 may serve as a thermal transfer path together with the heat release column 150.

The heat release column 150 may not be in contact with signal wirings 141, 143 and 145, and may be separated therefrom. For example, the first hole 152 may be formed through an area of the first substrate 100 at which the signal wirings 141, 143 and 145 may not be distributed. Thus, an insulation between the heat release column 150 and the signal wirings 141, 143 and 145 may be achieved so that an electrical disturbance or interference by the heat release column 150 may be avoided.

Figure 3:
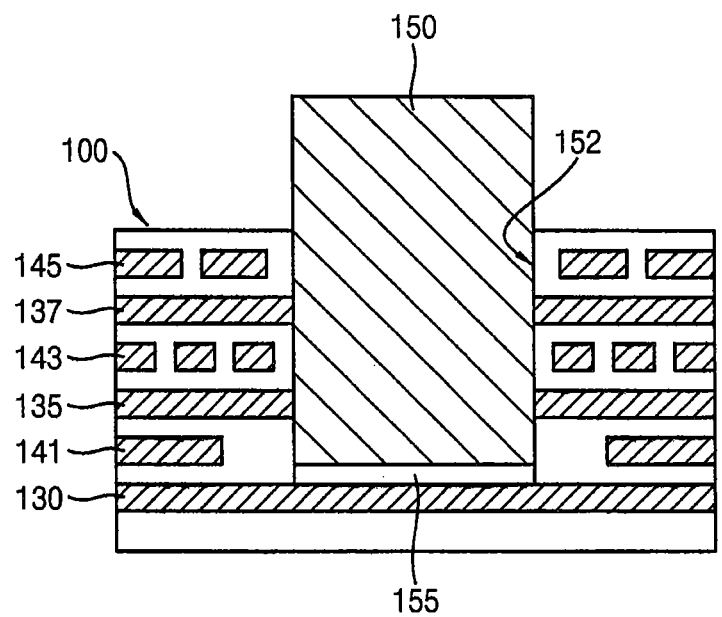

Referring to FIG. 3, a third thermal conductive adhesive 155 may be interposed between a bottom of the heat release column 150 and the top surface of the first ground wiring 130. The third thermal conductive adhesive 155 may include, e.g., a TIM.

Accordingly, an adhesion and a thermal conductivity between the heat release column 150 and the first ground wiring 130 may be additionally improved. Further, a thermal resistance between the heat release column 150 and the first ground wiring 130 may be reduced.

Figure 4:
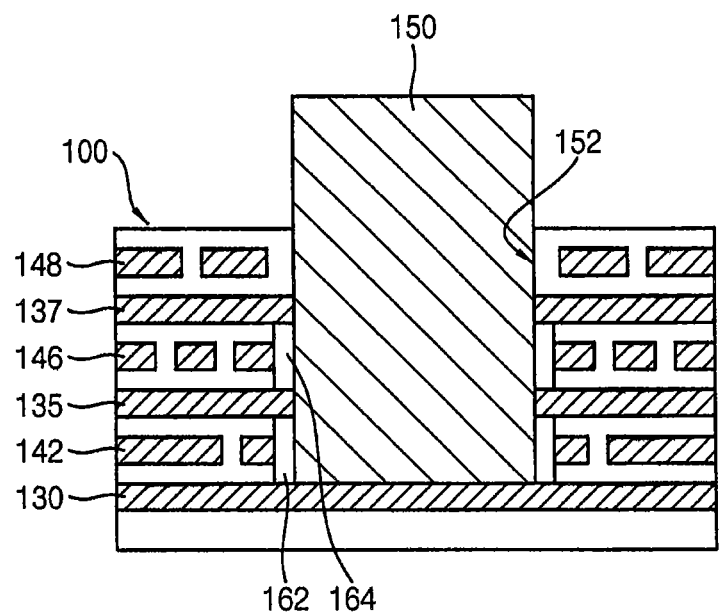

Referring to FIG. 4, an additional insulation pattern may be formed such that a direct contact between signal wirings 142, 146 and 148, and the heat release column 150 may be avoided.

For example, if the signal wirings 142, 146 and 148 are at least partially exposed by the first hole 152, insulation patterns 162 and 164 may be formed on lateral surfaces of the exposed signal wirings 142, 146 and 148 (e.g., 142 and 146).

In some embodiments, a lateral portion of the first signal wiring 142 exposed by the first hole 152 may be oxidized to be converted into the first insulation pattern 162. Alternatively, an oxide layer may be deposited on the lateral portion of the first signal wiring 142 to form the first insulation pattern 162.

Similarly, if a lateral portion of the second signal wiring 146 is exposed by the first hole 152, the second insulation pattern 164 may be formed on the lateral portion of the second signal wiring 146.

Figure 5:
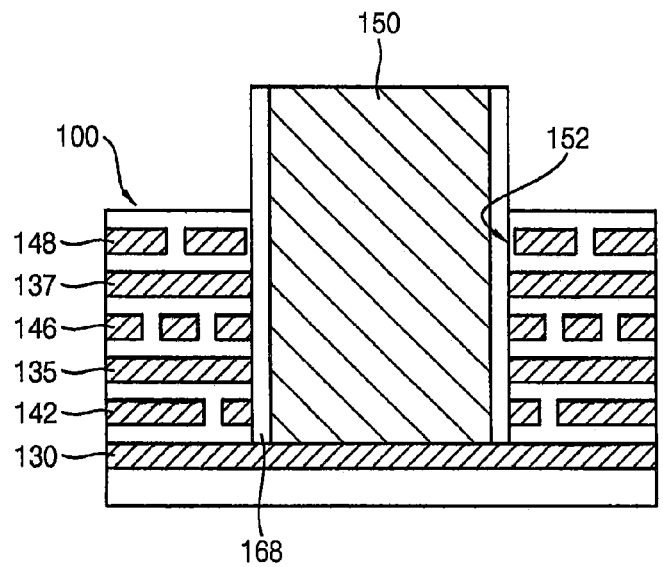

Referring to FIG. 5, an insulation material such as an oxide or a silicone-based adhesive may be coated on a lateral portion of the heat release column 150 to form an insulation layer pattern 168, and then the heat release column 150 may be inserted through the first hole 152. In an embodiment, the insulation layer pattern 168 may include a thermally conductive material such as a TIM.

Accordingly, the insulation layer pattern 168 having, e.g., a ring shape may laterally surround the heat release column 150 so that a direct contact between the heat release column 150 and the signal wirings 142, 146 and 148 may be prevented.

Figure 6:
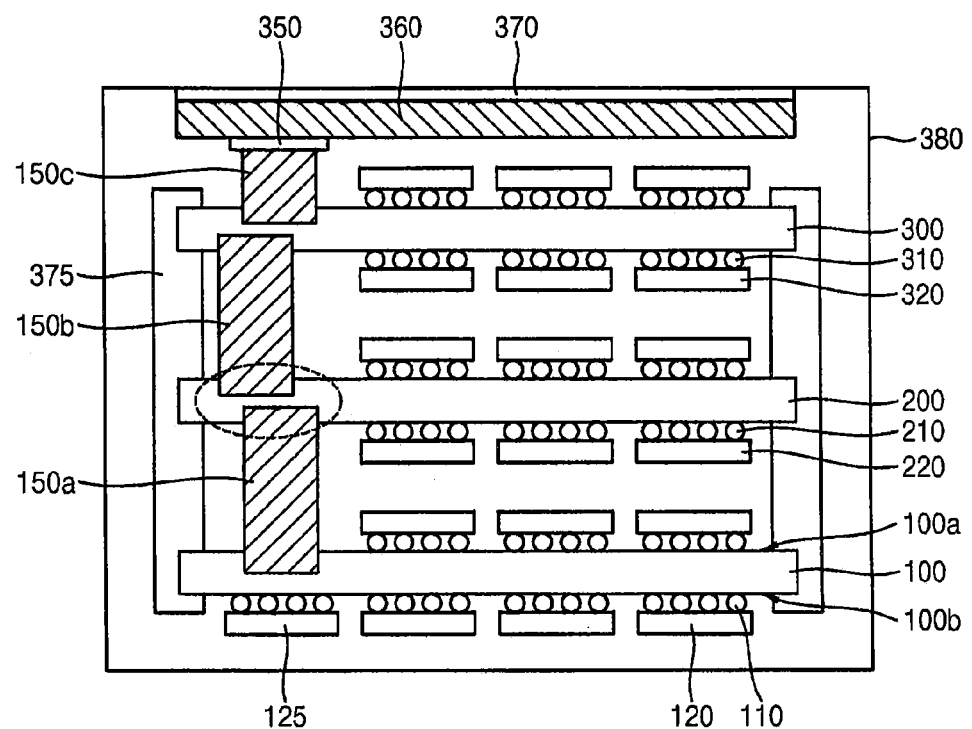

FIG. 6 is a cross-sectional view illustrating a multi-stacked structure of semiconductor packages in accordance with some example embodiments.

The multi-stacked structure illustrated in FIG. 6 may have elements and/or constructions substantially the same as or similar to those of the multi-stacked structure illustrated in FIGS. 1A and 1B except for a structure of a heat release column. Thus, detailed descriptions on the repeated elements and/or structures are omitted herein, and like reference numerals are used to designate like elements.

Referring to FIG. 6, the multi-stacked structure may include a heat release column stack. For example, a plurality of heat release columns may be stacked along a vertical direction of the multi-stacked structure.

In example embodiments, first to third heat release columns 150a, 150b and 150c may be stacked vertically in a zigzag arrangement.

The first heat release column 150a may be interposed between a first substrate 100 and a second substrate 200. For example, the first heat release column 150a may be inserted in an upper portion of the first substrate 100 and a lower portion of the second substrate 200.

The second heat release column 150b may be interposed between a second substrate 200 and a third substrate 300. For example, the second heat release column 150b may be inserted in an upper portion of the second substrate 200 and a lower portion of the third substrate 300.

The third heat release column 150c may be interposed between the third substrate 300 and a heat dissipation plate 360. For example, the third heat release column 150c may be inserted in an upper portion of the third substrate 300, and may be thermally connected to the heat dissipation plate 360 via a first thermal conductive adhesive 350.

For example, a top surface of the first heat release column 150a and a bottom of the second heat release column 150b may partially overlap each other in the vertical direction. A top surface of the second heat release column 150b and a bottom of the third heat release column 150c may partially overlap each other in the vertical direction.

FIGS. 7 to 10 are partially enlarged cross-sectional views of a portion indicated by a dotted circle in FIG. 6.

Figure 7:
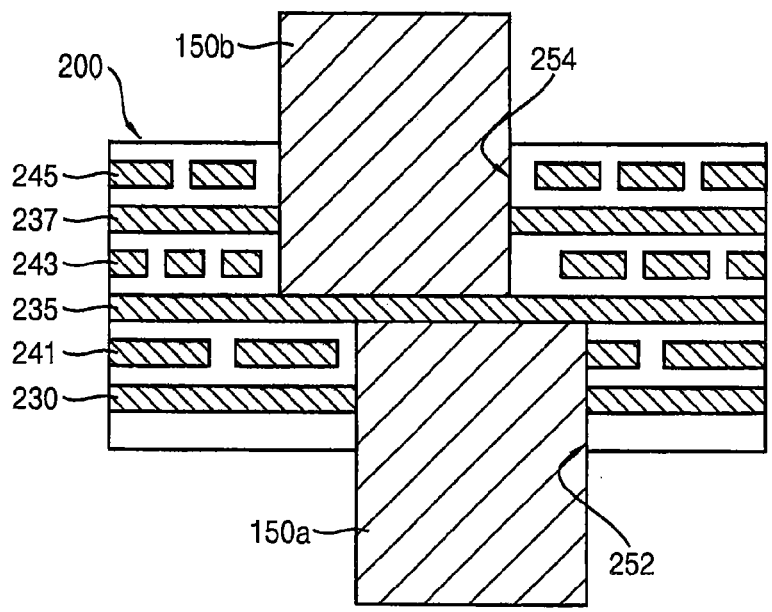

Referring to FIG. 7, the second substrate 200 may include a plurality of circuit wirings similar to those of the first substrate 100. For example, first to third ground wirings 230, 235 and 237, and first to third signal wirings 241, 243 and 245 may be formed in the second substrate 200.

The first heat release column 150a may be inserted in a second hole 252 extending through the lower portion of the second substrate 200, and may be in contact with, e.g., the second ground wiring 235. The second heat release column 150b may be inserted in a third hole 254 extending through the upper portion of the second substrate 200 to be in contact with the second ground wiring 235.

In this case, a bottom of the second ground wiring 235 and a lateral portion of the first ground wiring 230 may be exposed through the second hole 252. The second hole 252 may extend through a region at which the first signal wiring 241 may not be distributed. Thus, the first heat release column 150a may be in direct contact with the lateral portion of the first ground wiring 230 and the bottom of the second ground wiring 235, and may be physically spaced apart from the first signal wiring 241.

A top surface of the second ground wiring 235 may be exposed through the third hole 254, and a lateral portion of the third ground wiring 237 may be also exposed by the third hole 254. The third hole 254 may extend through a region at which the second and third signal wirings 243 and 245 may not be distributed. Thus, the second heat release column 150b may be in direct contact with the lateral portion of the third ground wiring 237 and the top surface of the second ground wiring 235, and may be physically spaced apart from the second and third signal wirings 243 and 245.

As described with reference to FIGS. 6 and 7, the heat release columns 150a, 150b and 150c may be stacked in a zigzag arrangement to partially overlap each other, so that an area or a volume for absorbing and/or releasing a heat may be increased. Further, the heat release columns 150a, 150b and 150c may be thermally connected by the ground wiring so that an efficiency of a heat transfer may be improved.

When a common hole extending through a plurality of the substrates as illustrated in FIG. 1 may not be easily formed due to a circuit construction, the holes may be distributed throughout the substrates in the zigzag arrangement so that the heat release columns may be formed in the holes.

Figure 8:
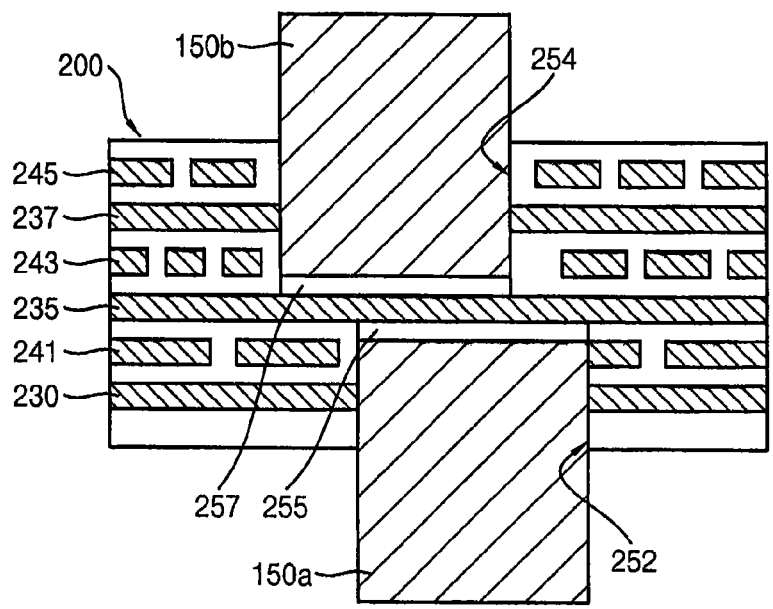

Referring to FIG. 8, the heat release columns 150a, 150b and 150c may be connected to the ground wirings via thermal conductive adhesives as illustrated with reference to FIG. 3.

For example, a fourth thermal conductive adhesive 255 may be interposed between the first heat release column 150a and the bottom of the second ground wiring 235. A fifth thermal conductive adhesive 257 may be interposed between the second heat release column 150b and the top surface of the second ground wiring 235. The fourth and fifth thermal conductive adhesives 255 and 257 may include, e.g., a TIM. The first and second heat release columns 150a and 150b may be easily landed on the second ground wiring 235 by the fourth and fifth thermal conductive adhesives 255 and 257. Further, a thermal conductivity from the second ground wiring 235 to the first and second heat release columns 150a and 150b may be improved, and a thermal resistance may be reduced.

Figure 9:
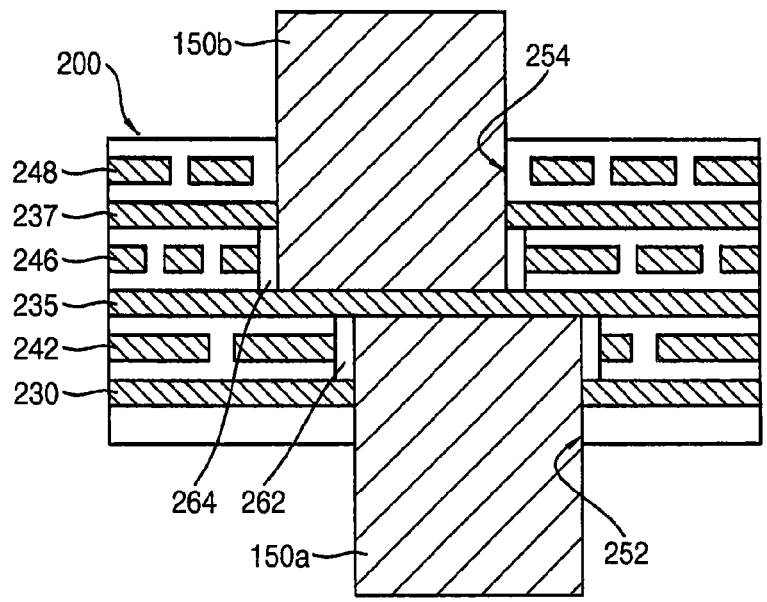

Referring to FIG. 9, and also as illustrated in FIG. 4, if signal wirings 242, 246 and 248 are exposed by the second hole 252 and/or the third hole 254, an insulation pattern may be formed on a lateral portion of the exposed signal wiring.

For example, as illustrated in FIG. 9, if the lateral portion of the first signal wiring 242 is exposed by the second hole 252, a first insulation pattern 262 may be formed on the lateral portion. If the lateral portion of the second signal wiring 246 is exposed by the third hole 254, a second insulation pattern 264 may be formed on the lateral portion.

An electrical disturbance or interference due to the first and second heat release columns 150a and 150b may be prevented by the first and second insulation patterns 262 and 264.

Figure 10:
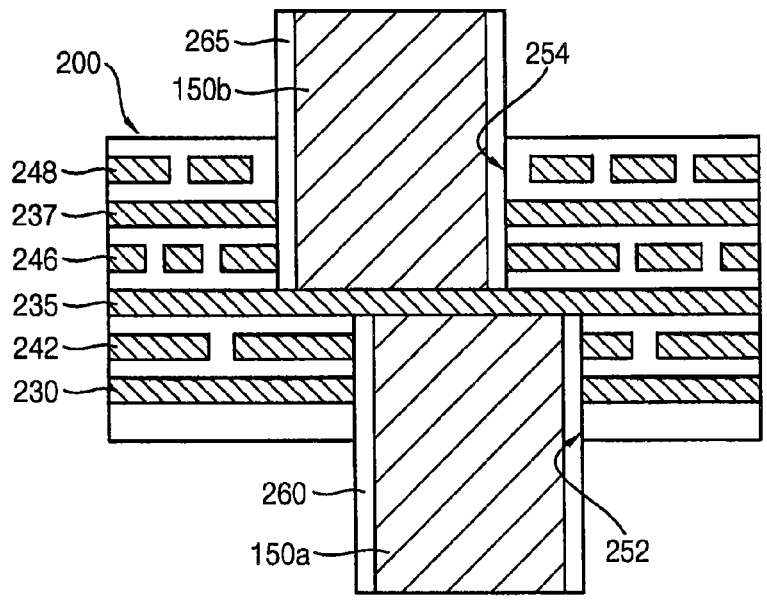

Referring to FIG. 10, and also as illustrated with reference to FIG. 5, an insulation layer pattern may be formed on a sidewall of the heat release column.

For example, a first insulation layer pattern 260 may be formed on the sidewall of the first heat release column 150a, and a second insulation layer pattern 265 may be formed on the sidewall of the second heat release column 150b. Accordingly, an insulation between the heat release columns 150a and 150b, and the signal wirings 242, 246 and 248 may be achieved.

Figure 11:
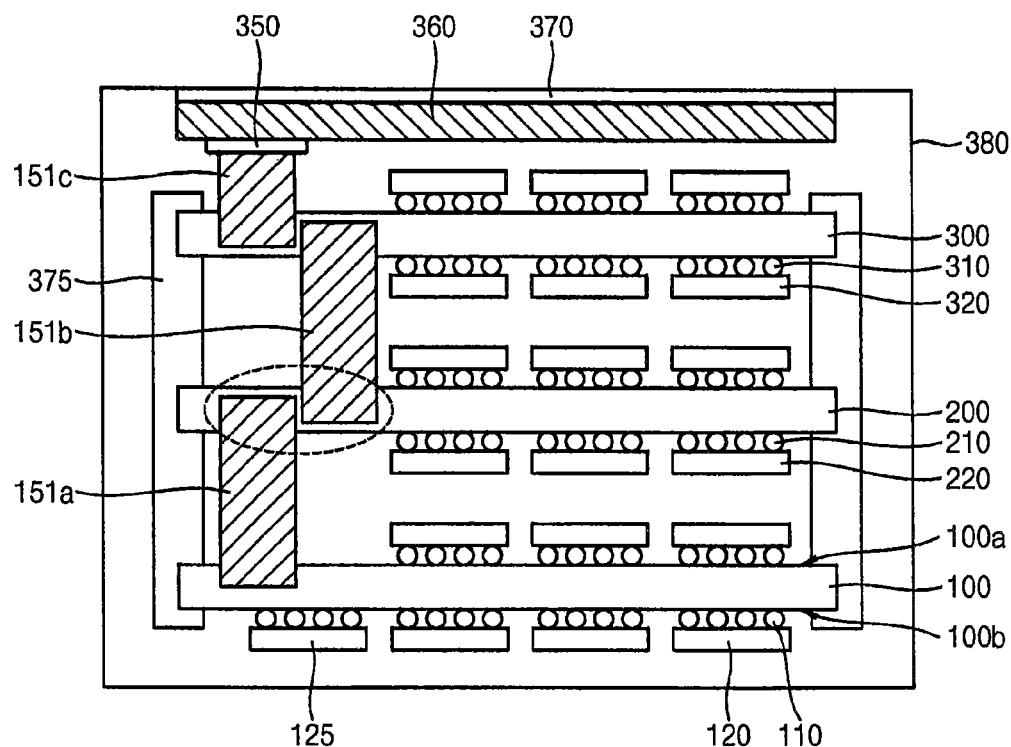

FIG. 11 is a cross-sectional view illustrating a multi-stacked structure of semiconductor packages in accordance with some example embodiments;

The multi-stacked structure illustrated in FIG. 11 may have elements and/or constructions substantially the same as or similar to those of the multi-stacked structure illustrated in FIG. 1A or FIG. 6 except for a structure of a heat release column. Thus, detailed descriptions on the repeated elements and/or structures are omitted herein, and like reference numerals are used to designate like elements.

Referring to FIG. 11, a plurality of heat release columns may be stacked vertically along the multi-stacked structure.

In example embodiments, first to third heat release columns 151a, 151b and 151c may be stacked vertically in a zigzag arrangement.

The first heat release column 151a may be interposed between first and second substrates 100 and 200. For example, the first heat release column 151a may be inserted through an upper portion of the first substrate 100 and a lower portion of the second substrate 200.

The second heat release column 151b may be interposed between the second substrate 200 and a third substrate 300. For example, the second heat release column 151b may be inserted through an upper portion of the second substrate 200 and a lower portion of the third substrate 300.

The third heat release column 151c may be interposed between the third substrate 300 and a heat dissipation plate 360. For example, the third heat release column 151c may be inserted through an upper portion of the third substrate 300, and may be thermally connected to the heat dissipation plate 360 via a first thermal conductive adhesive 350.

For example, lateral surfaces of the first heat release column 151a and the second heat release column 151b may partially overlap in a horizontal direction of the multi-stacked structure. In this case, an upper sidewall of the first heat release column 151a and a lower sidewall of the second heat release column 151b may overlap each other in the horizontal direction.

Lateral surfaces of the second heat release column 151b and the third heat release column 151c may also overlap each other in the horizontal direction. In this case, an upper sidewall of the second heat release column 151b and a lower sidewall of the third heat release column 151c may overlap each other in the horizontal direction.

FIGS. 12 to 15 are partially enlarged cross-sectional views of a portion indicated by a dotted circle in FIG. 11.

Figure 12:
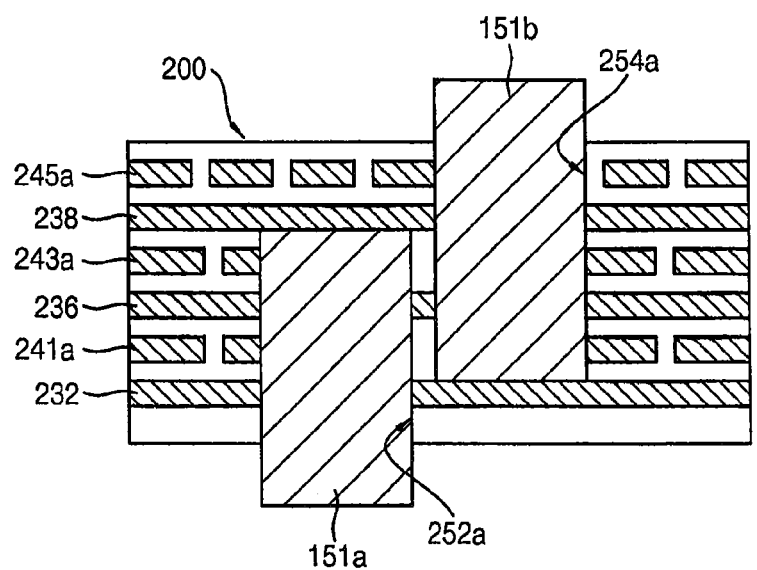

Referring to FIG. 12, the first heat release column 151a may be in contact with, e.g., lateral portions of a first ground wiring 232 and a second wiring 236, and a bottom of a third ground wiring 238. In this case, a second hole 252a may be formed from the lower portion of the second substrate 200 and may extend through the first ground wiring 232 and the second ground wiring 236. The bottom of the third ground wiring 238 may be exposed by the second hole 252a. An upper portion of the first heat release column 151a may be inserted in the second hole 252a and may be in contact with the bottom of the third ground wiring 238.

The second heat release column 151b may be in contact with lateral portions of a third ground wiring 238 and the second ground wiring 236, and a top surface of the first ground wiring 232. In this case, a third hole 254a may be formed from the upper portion of the second substrate 200, and may extend through the third ground wiring 238 and the second ground wiring 236. The top surface of the first ground wiring 232 may be exposed by the third hole 254a. A lower portion of the second heat release column 151b may be inserted in the third hole 254a and may be in contact with the top surface of the first ground wiring 232.

As described with reference to FIG. 12, the first and second heat release columns 151a and 151b may overlap each other in the horizontal direction, and may form a parallel connection by the ground wirings 232, 236 and 238.

Thus, a thermal resistance between the heat release columns 151a and 151b may be reduced, and a heat generated from, e.g., the second substrate 200 may be effectively released and/or emitted through the heat release columns 151a and 151b.

Figure 13:
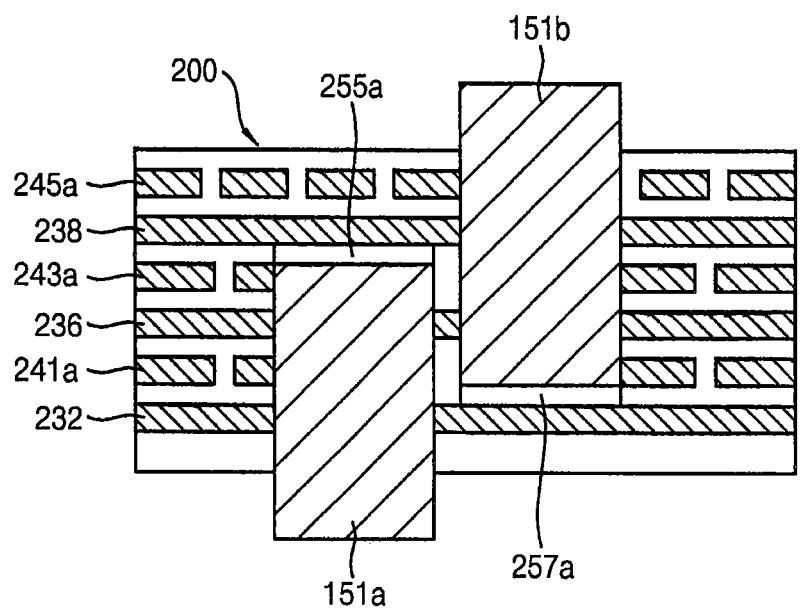

Referring to FIG. 13, and also as illustrated in FIG. 8, the first heat release column 151a may be connected to the bottom of the third ground wiring 238 via a fourth thermal conductive adhesive 255a. The second heat release column 151b may be connected to the top surface of the first ground wiring 232 via a fifth thermal conductive adhesive 257a.

Figure 14:
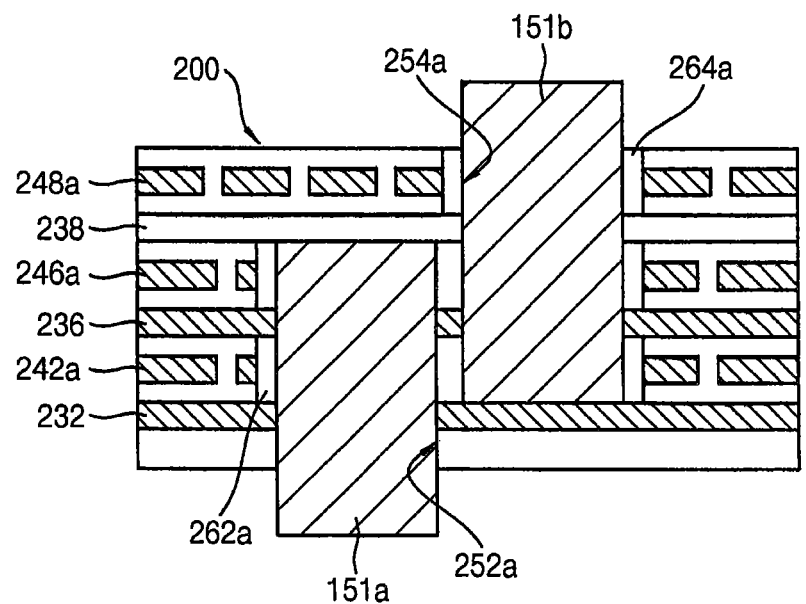

Referring to FIG. 14, and also as illustrated in FIG. 9, insulation patterns may be formed on lateral portions of signal wirings exposed by the second and third holes 252a and 254a, so that a direct contact between the heat release columns 151a and 151b, and the signal wirings may be avoided.

For example, first insulation patterns 262a may be formed on the lateral portions of first and second signal wirings 242a and 246a exposed by the second hole 252a. Second insulation patterns 264a may be formed on the lateral portions of first to third signal wirings 242a, 246a and 248a exposed by the third hole 254a.

Figure 15:
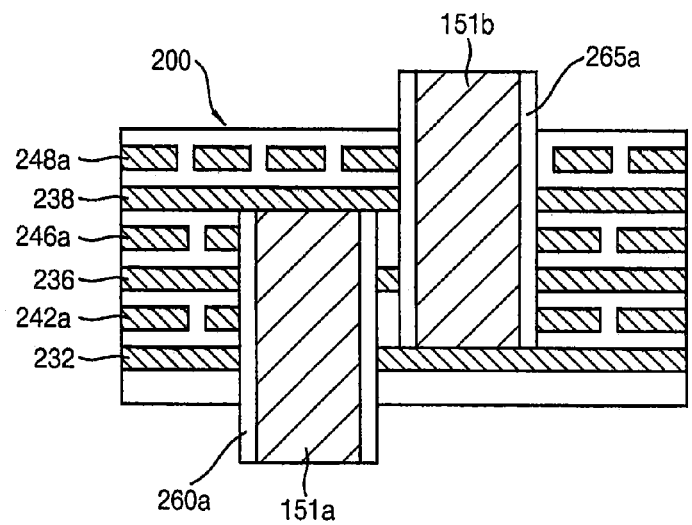

Referring to FIG. 15, and also as illustrated in FIG. 10, a first insulation layer pattern 260a and a second insulation layer pattern 265a may be formed on sidewalls of the first heat release column 151a and the second heat release column 151b, respectively. Accordingly, a direct contact between the heat release columns 151a and 151b, and the signal wirings 242a, 246a and 248a may be avoided to prevent an electrical disturbance or interference.

Figure 16:
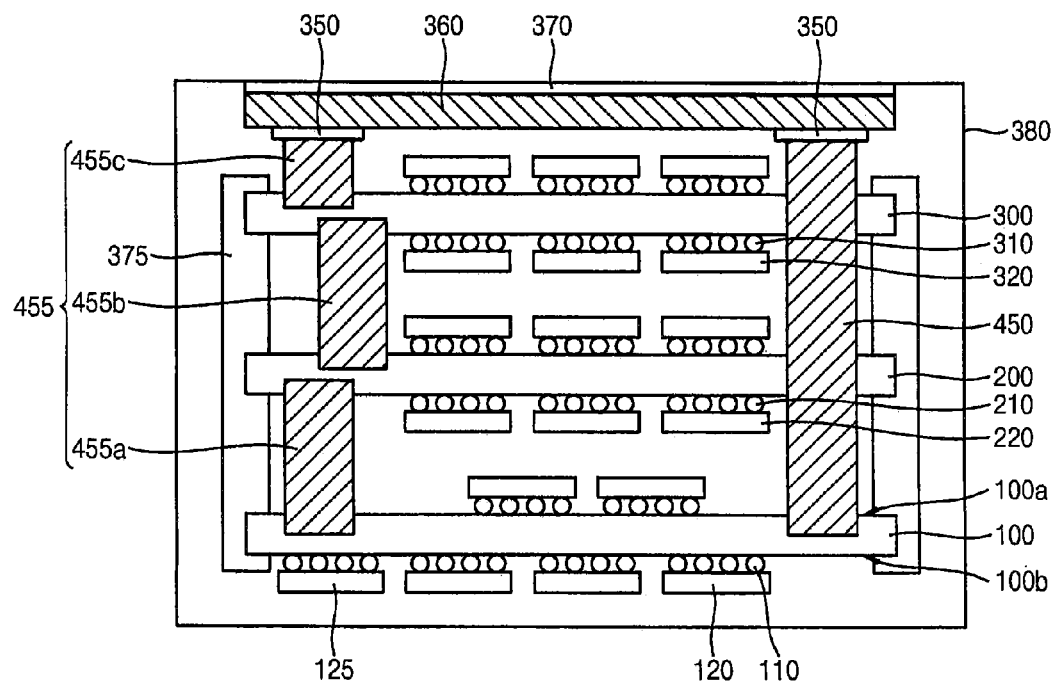

FIG. 16 is a cross-sectional view illustrating a multi-stacked structure of semiconductor packages in accordance with some example embodiments.

Detailed descriptions on elements and/or structures substantially the same as or similar to those illustrated with reference to FIGS. 1A, 6 and 11 are omitted herein, and like reference numerals are used to designate like elements.

Referring to FIG. 16, the multi-stacked package may include a common heat release column 450 and a stacked heat release column 455.

In example embodiments, the common heat release column 450 may have a structure substantially the same as or similar to that of the heat release column 150 illustrated in FIG. 1A. For example, the common heat release column 450 may extend in a vertical direction of the multi-stacked structure, and may extend commonly through first to third substrates 100, 200 and 300.

In some embodiments, the common heat release column 450 may be embedded in an upper portion of a first substrate 100, and may extend through a second substrate 200 and a third substrate 300 to be in contact with a first thermal conductive adhesive 350.

As illustrated with reference to FIGS. 2 to 5, the common heat release column 450 may be landed on or be in contact with a top surface of a ground wiring included in the first substrate 100. The common heat release column 450 may be also in contact with ground wirings included in the first to third substrates 100, 200 and 300, and may be spaced apart from signal wirings. An insulation layer pattern may be formed on a sidewall of the common heat release column 450.

In example embodiments, the stacked heat release column 455 may include first to third heat release columns 455a, 455b and 455c vertically stacked in a zigzag arrangement.

In some embodiments, the stacked heat release column 455 may have a construction substantially the same as or similar to that of the heat release columns of FIG. 6. In this case, a top surface of the first heat release column 455a and a bottom of a second heat release column 455b may partially overlap each other, and a top surface of the second heat release column 455b and a bottom of the third heat release column 455c may partially overlap each other. A top surface of the third heat release column 455c may be in contact with the first thermal conductive adhesive 350.

In some embodiments, the stacked heat release column 455 may have a construction substantially the same as or similar to that of the heat release column of FIG. 11. In this case, sidewalls of the first to third heat release columns 455a, 455b and 455c may partially overlap each other.

The first heat release column 455a may be interposed between the first substrate 100 and the second substrate 200, and the second heat release column 455b may be interposed between the second substrate 200 and the third substrate 300. The third heat release column 455c may be inserted in an upper portion of the third substrate 300 and may be thermally connected to a heat dissipation plate 360.

As illustrated with reference to FIGS. 7 to 10, the first to third heat release columns 455a, 455b and 455c may be landed on or be in contact with a top surface or a bottom of a ground wiring. The first to third heat release columns 455a, 455b and 455c may be in contact with ground wirings included in the first to third substrates 100, 200 and 300, and may be spaced apart or insulated from signal wirings. An insulation layer pattern may be formed on the sidewalls of the first to third heat release columns 455a, 455b and 455c.

FIG. 16 illustrates that that the common heat release column 450 and the stack heat release column 455 are located at both end portions of the multi-stacked structure. However, the location of the common heat release column 450 and the stack heat release column 455 may be adjusted in consideration of a maximum heat generation area of each substrate.

Figure 17:
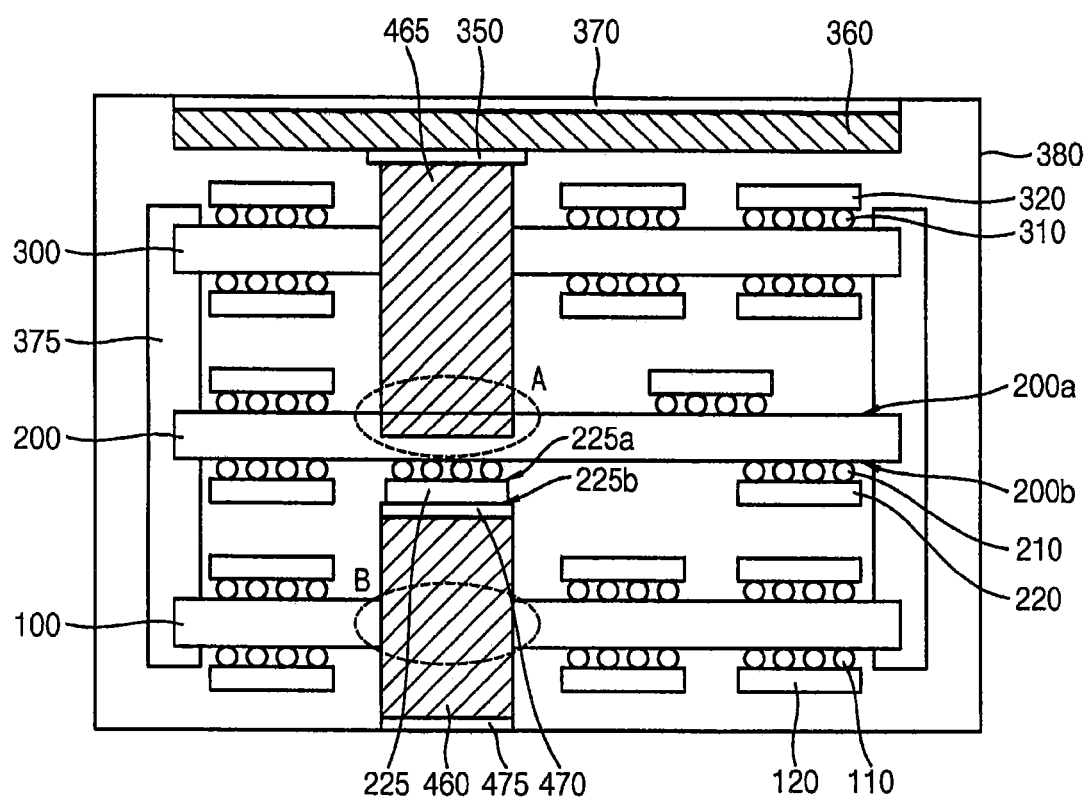

FIG. 17 is a cross-sectional view illustrating a multi-stacked structure of semiconductor packages in accordance with example embodiments.

Detailed descriptions on elements and/or structures substantially the same as or similar to those illustrated with reference to FIGS. 1A, 1B, 6 and 11 are omitted herein, and like reference numerals are used to designate like elements.

Referring to FIG. 17, the multi-stacked structure may include first to third stack structures as illustrated with reference to FIG. 1A. The first stack structure, the second stack structure and the third stack structure may include a first substrate 100, a second substrate 200 and a third substrate 300, respectively. A first semiconductor package 120, a second semiconductor package 220 and a third semiconductor package 320 may be mounted on the first substrate 100, the second substrate 200 and the third substrate 300, respectively, via a first conductive member 110, a second conductive member 210 and a third conductive member 310.

In example embodiments, a maximum heat generation package 225 among the semiconductor packages may be mounted on the substrate which may be placed between an uppermost substrate and a lowermost substrate. For example, the maximum heat generation package 225 may be mounted on the second substrate 200. The second substrate 200 may include a first surface 200a and a second surface 200b facing away from each other, and the maximum heat generation package 225 may be mounted on the second surface 200b of the second substrate 200. As mentioned above, the maximum heat generation package 225 may include a logic package.

In some embodiments, the maximum heat generation package 225 may be mounted at a central region of the second substrate 200. In this case, the second semiconductor package 220 may not be arranged at a predetermined area of the second substrate 200 adjacent to the maximum heat generation package 225 for preventing a deterioration of the semiconductor package due to a heat from the maximum heat generation package 225.

In example embodiments, a heat release column may include a first heat release column 460 and a second heat release column 465 which may overlap in a vertical direction of the multi-stacked structure.

The first heat release column 460 and the second heat release column 465 may be located on the same vertical line extending in the vertical direction. In example embodiments, the first heat release column 460 may be in contact with the maximum heat generation package 225.

For example, the maximum heat generation package 225 may include a mounting surface 225a with respect to the second substrate 200, and a non-mounting surface 225b facing the mounting surface 225a. A top surface of the first heat release column 460 may be in contact with the non-mounting surface 225b of the maximum heat generation package 225.

In some embodiments, a third thermal conductive adhesive 470 may be interposed between the non-mounting surface 225b of the maximum heat generation package 225, and the top surface of the first heat release column 460. Thus, an adhesion of the first heat release column 460 may be improved, and a thermal resistance between the first heat release column 460 and the maximum heat generation package 225 may be reduced.

In example embodiments, the first heat release column 460 may extend through the first substrate 100, and may be in contact with a fourth thermal conductive adhesive 475 formed on a lower surface of a case 380. Accordingly, a thermal resistance between the first heat release column 460 and the case 380 may be reduced, and an electrical disturbance or interference generated when the first heat release column 460 is in direct contact with the case 380 may be avoided.

In some embodiments, an additional heat dissipation plate may be formed on the lower surface of the case 380. In this case, the fourth thermal conductive adhesive 475 may be interposed between the first heat release column 460 and the additional heat dissipation plate. Further, a fifth thermal conductive adhesive may be interposed between the lower surface of the case 380 and the additional heat dissipation plate.

The second heat release column 465 may extend through the third substrate 300, and may partially extend through the second substrate 200. Accordingly, the second heat release column 465 may be inserted in an upper portion of the second substrate 200.

An upper portion of the second heat release column 465 may be in contact with a first thermal conductive adhesive 350, and thus may be thermally connected to a heat dissipation plate 360. The heat dissipation plate 360 may be thermally connected to the case 380 via a second thermal conductive adhesive 370.

As described with reference to FIG. 17, when the maximum heat generation package 225 is disposed in the middle of the multi-stacked structure, a heat from the maximum heat generation package 225 may be effectively released or emitted through the heat release columns extending upwardly and downwardly from the maximum heat generation package 225. As described above, the first heat release column 460 may be in contact with the non-mounting surface 225b of the maximum heat generation package 225 so that the heat from the maximum heat generation package 225 may be directly absorbed or emitted by the first heat release column 460. The second heat release column 465 may be disposed directly over the mounting surface 225a of the maximum heat generation package 225 and thermally connected to the case 380 so that an efficiency of a heat release may be maximized.

Figure 18:
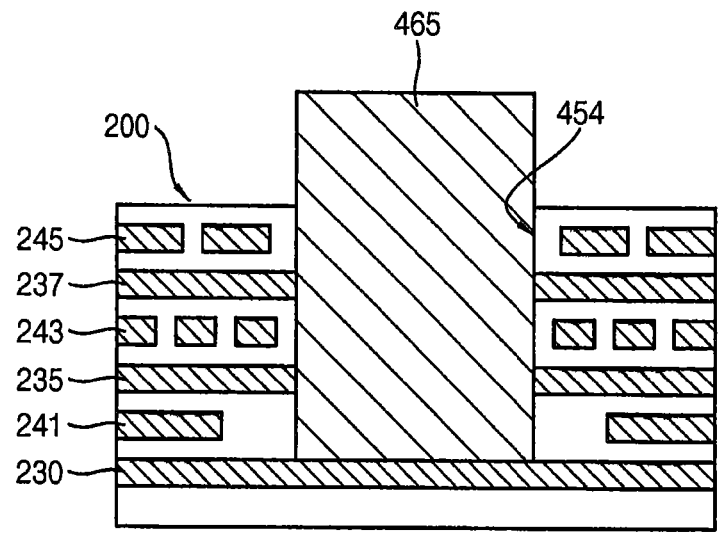

FIG. 18 is a partially enlarged cross-sectional view of a portion indicated by a dotted circle "A" in FIG. 17.

Referring to FIG. 18, a second hole 454 may be formed partially through the second substrate 200, and a top surface of a first ground wiring 230 may be exposed through the second hole 454. The second heat release column 465 may be inserted in the second hole 454 to be in contact with the top surface of the first ground wiring 230. The second heat release column 465 may be also in contact with lateral portions of a second ground wiring 235 and a third ground wiring 237 exposed by the second hole 454. The second heat release column 465 may not be in contact with first to third signal wirings 241, 243 and 245.

In some embodiments, and also as illustrated in FIG. 3, a thermal conductive adhesive may be formed between the first ground wiring 230 and the second heat release column 465 to reduce a thermal resistance therebetween.

In some embodiments, and also as illustrated in FIG. 4, when the signal wirings 241, 243 and 245 are exposed by the second hole 454, insulation patterns may be formed on lateral portions of the signal wirings 241, 243 and 245.

In some embodiments, and also as illustrated with reference to FIG. 5, an insulation layer pattern may be formed on a sidewall of the second heat release column 465.

Figure 19:
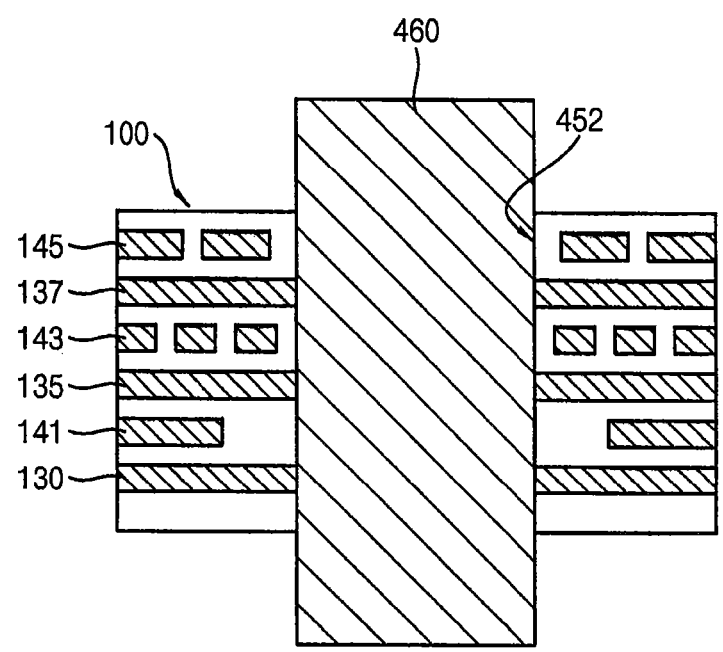

FIG. 19 is a partially enlarged cross-sectional view of a portion indicated by a dotted circle "B" in FIG. 17.

Referring to FIG. 19, a first hole 452 may be formed through the first substrate 100, and the first heat release column 460 may be inserted in the first hole 452 and may extend therethrough. Lateral portions of ground wirings 130, 135 and 137 included in the first substrate 100 may be exposed by the first hole 452, and the first heat release column 460 may be in contact with the exposed lateral portions of the ground wirings 130, 135 and 137. The first heat release column 460 may not be in contact with signal wirings 141, 143 and 145, and may be spaced apart therefrom.

In some embodiments, and also as illustrated in FIG. 4, when signal wirings 141, 143 and 145 are exposed by the first hole 452, insulation patterns may be formed on lateral portions of the signal wirings 141, 143 and 145.

In some embodiments, and also as illustrated with reference to FIG. 5, an insulation layer pattern may be formed on a sidewall of the first heat release column 460.

Figure 20:
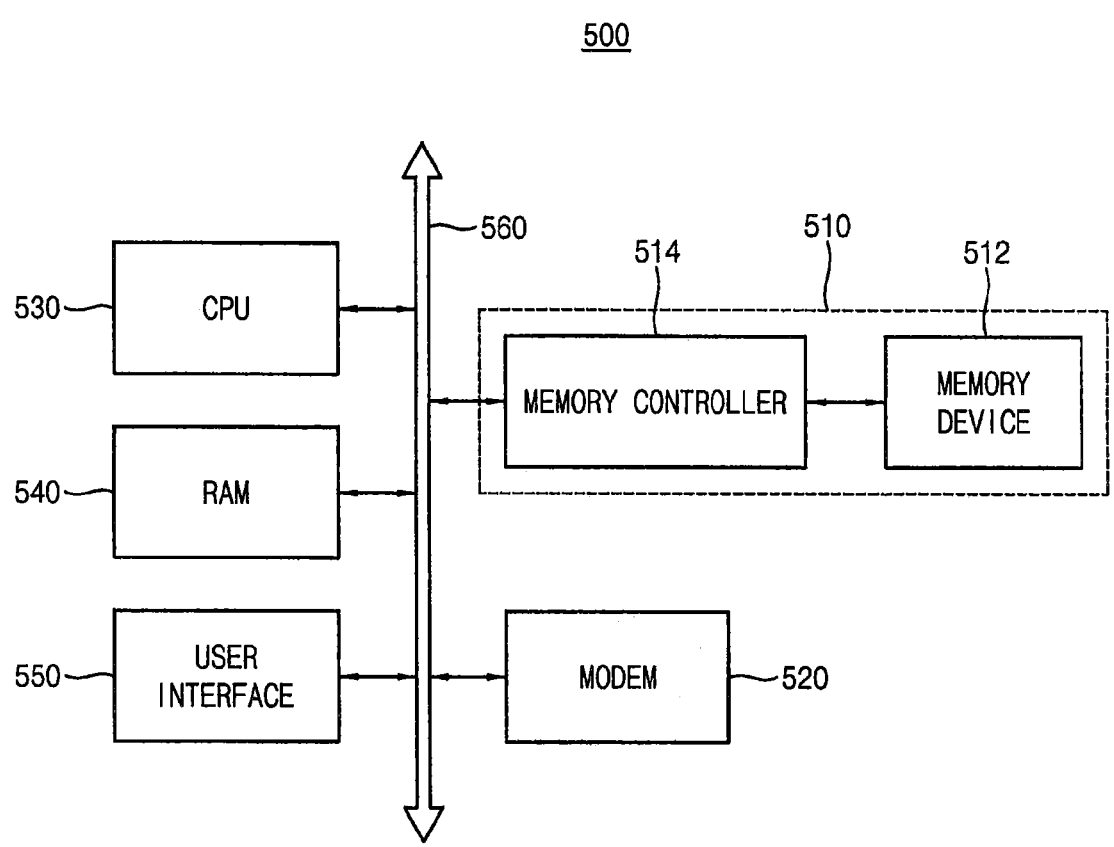

FIG. 20 is a schematic block diagram illustrating an information processing system in accordance with example embodiments.

Referring to FIG. 20, an information processing system 500 may be implemented to, e.g., a mobile device or a computer. The information processing system 500 may include a CPU 530, a RAM 540, an user interface 550, a modem 520 such as a baseband chipset and a memory system 510 electrically connected to a system bus 560. The memory system 510 may include a memory device 512 and a memory controller 514. The memory controller 514 may have a construction capable of controlling the memory device 512. The memory device 512 may be provided as the multi-stacked structure of semiconductor packages in accordance with example embodiments. The memory system 510 may be provided as, e.g., a memory card or a solid state disk (SSD) by a combination of the memory device 512 and the memory controller 511.

According to example embodiments of the present inventive concepts, a heat release column may extend commonly through a plurality of substrates included in a multi-stacked structure of semiconductor packages. For example, the heat release column may extend throughout the substrates and may directly absorb and release a heat from each substrate. Additionally, the heat release column may be directly on a maximum heat generation area of the substrate so that a heat releasing efficiency may be maximized. The heat release column may be in contact with ground wirings included in the substrate, and may not be in contact with signal wirings. Thus, the heat releasing efficiency may be further improved without affecting an operation of the multi-stacked structure.

The foregoing is illustrative of example embodiments and is not to be construed as limiting thereof. Although a few example embodiments have been described, those skilled in the art will readily appreciate that many modifications are possible in the example embodiments without materially departing from the novel teachings and advantages of the present inventive concept. Accordingly, all such modifications are intended to be included within the scope of the present inventive concept as defined in the claims. In the claims, means-plus-function clauses are intended to cover the structures described herein as performing the recited function and not only structural equivalents but also equivalent structures. Therefore, it is to be understood that the foregoing is illustrative of various example embodiments and is not to be construed as limited to the specific example embodiments disclosed, and that modifications to the disclosed example embodiments, as well as other example embodiments, are intended to be included within the scope of the appended claims.

What is claimed is:
1. A multi-stacked structure of semiconductor packages, comprising:
   a plurality of substrates stacked in a vertical direction, wherein at least one substrate comprises signal wirings and ground wirings;

semiconductor packages mounted on each substrate of the plurality of substrates;

a heat release column extending substantially vertically through the plurality of substrates, the heat release column overlapping at least one of the semiconductor packages serving as a heat generation source, wherein the heat release column is in contact with the ground wirings in the at least one substrate, and is spaced apart from the signal wirings in the at least one substrate; and a heat dissipation part thermally connected to one end of the heat release column.

2. The multi-stacked structure of claim 1, wherein the heat release column is directly on a maximum heat generation package.

3. The multi-stacked structure of claim 2, wherein the maximum heat generation package is mounted on a lower surface of a lowermost substrate among the plurality of substrates.

4. The multi-stacked structure of claim 1, wherein the heat release column is connected to a top surface of one of the ground wirings included in a lowermost substrate among the plurality of substrates.

5. The multi-stacked structure of claim 4, further comprising a thermal conductive adhesive interposed between a bottom of the heat release column and the top surface of the one of the ground wirings.

6. The multi-stacked structure of claim 5, wherein the thermal conductive adhesive comprises a thermal interface material (TIM).

7. The multi-stacked structure of claim 1, further comprising an insulation layer pattern surrounding a sidewall of the heat release column.

8. The multi-stacked structure of claim 1, further comprising a case that accommodates the plurality of substrates, wherein the heat dissipation part comprises:
a first thermal conductive adhesive in contact with the heat release column;
a second thermal conductive adhesive in contact with the case; and
a thermal dissipation plate between the first thermal conductive adhesive and the second thermal conductive adhesive.

9. The multi-stacked structure of claim 1, wherein the heat release column comprises a plurality of stacked heat release columns which partially overlap each other along the vertical direction.

10. The multi-stacked structure of claim 9, wherein each substrate comprises signal wirings and ground wirings, and
wherein neighboring stacked heat release columns among the plurality of stacked heat release columns are connected to each other by the ground wirings.

11. A multi-stacked structure of semiconductor packages, comprising:
a first substrate, a second substrate and a third substrate sequentially stacked in a vertical direction;
a plurality of semiconductor packages mounted on the first substrate, the second substrate and the third substrate;
a first heat release column extending through the first substrate and in contact with a semiconductor package mounted on the second substrate; and
a second heat release column overlapping the first heat release column in the vertical direction, the second heat release column extending through the third substrate and the second substrate.

12. The multi-stacked structure of claim 11, wherein the semiconductor package in contact with the first heat release column is a maximum heat generation package.

13. The multi-stacked structure of claim 11, wherein the semiconductor package in contact with the first heat release column comprises a mounting surface and a non-mounting surface, the mounting surface being connected to the second substrate via conductive members, the non-mounting surface facing the mounting surface, and
further comprising a thermal conductive adhesive between a top surface of the first heat release column and the non-mounting surface.

14. The multi-stacked structure of claim 11, wherein each of the first substrate, the second substrate and the third substrate comprises ground wirings and signal wirings, and
wherein the second heat release column extends partially through the second substrate such that the second heat release column is connected to a top surface of one of the ground wirings in the second substrate.

15. A multi-stacked structure of semiconductor packages, comprising:
a first substrate, a second substrate and a third substrate sequentially stacked in a vertical direction;
a plurality of semiconductor packages mounted on the first substrate, the second substrate and the third substrate;
a first heat release column extending through an upper portion of the first substrate and a lower portion of the second substrate;
a second heat release column extending through an upper portion of the second substrate and a lower portion of the third substrate; and
a third heat release column extending through an upper portion of the third substrate and thermally connected to a heat dissipation part.

16. The multi-stacked structure of claim 15, wherein lateral surfaces of the first heat release column and second heat release column partially overlap in a horizontal direction of the multi-stacked structure, and wherein lateral surfaces of the second and third heat release columns partially overlap in the horizontal direction.

17. The multi-stacked structure of claim 15, wherein the second substrate comprises ground wirings, wherein the first heat release column is in contact with at least one of the ground wirings in the second substrate, and wherein the second heat release column is in contact with at least one of the ground wirings in the second substrate.

18. The multi-stacked structure of claim 17, wherein the first and second heat release columns form a parallel connection via the ground wirings.

19. The multi-stacked structure of claim 15, further comprising an insulation layer pattern surrounding a sidewall of the first and second heat release columns.

* * * * *